United States Patent [19]

Tateno

[11] Patent Number: 5,387,875
[45] Date of Patent: Feb. 7, 1995

[54] OUTPUT CIRCUIT CAPABLE OF DRIVING A VIBRATION DEVICE

[75] Inventor: Makoto Tateno, Tokyo, Japan

[73] Assignee: Rion Kabushiki Kaisha, Kokubunji, Japan

[21] Appl. No.: 183,975

[22] Filed: Jan. 21, 1994

[30] Foreign Application Priority Data

Jan. 29, 1993 [JP] Japan .................................. 5-034324

[51] Int. Cl.⁶ ............................................. H03F 3/38
[52] U.S. Cl. ..................................... 330/10; 330/251; 381/68.4; 381/120
[58] Field of Search ................. 330/10, 207 A, 251; 381/68.4, 120

[56] References Cited

U.S. PATENT DOCUMENTS

| | | | |
|---|---|---|---|
| 3,629,616 | 12/1971 | Walker | 330/10 X |
| 4,240,036 | 12/1980 | Kohler | 330/10 |
| 5,014,016 | 5/1991 | Anderson | 330/10 |

FOREIGN PATENT DOCUMENTS

1604 1/1981 Japan .................................. 330/10

OTHER PUBLICATIONS

Technological Report "An Output Amplifier Whose Time Has Come" by Elmer V. Carlson, Hearing Instruments, vol. 39, No. 10, 1988.

*Primary Examiner*—James B. Mullins
*Attorney, Agent, or Firm*—William S. Frommer; Alvin Sinderbrand

[57] ABSTRACT

In an output circuit for pulse width modulation of an input signal and output of it to a predetermined vibrating section, power consumption is remarkably reduced with a comparatively simple configuration. The output circuit with a comparatively simple configuration which can drive a vibrating section at high efficiency without consuming unnecessary power can be realized by providing a polarity inverter circuit which inverts the polarity of an input signal and outputs it as an inverted input signal, comparing the instantaneous level of the input signal with that of the output signal from an oscillator circuit by a first comparator circuit, comparing the instantaneous level of the inverted input signal with that of an output signal from the oscillator circuit by a second comparator circuit, and thereafter, forming a drive signal based on the first and second comparison results and sending it to a drive section, thus obtaining the formation of a drive signal having a duty ratio corresponding to the instantaneous amplitude of the input signal.

7 Claims, 10 Drawing Sheets

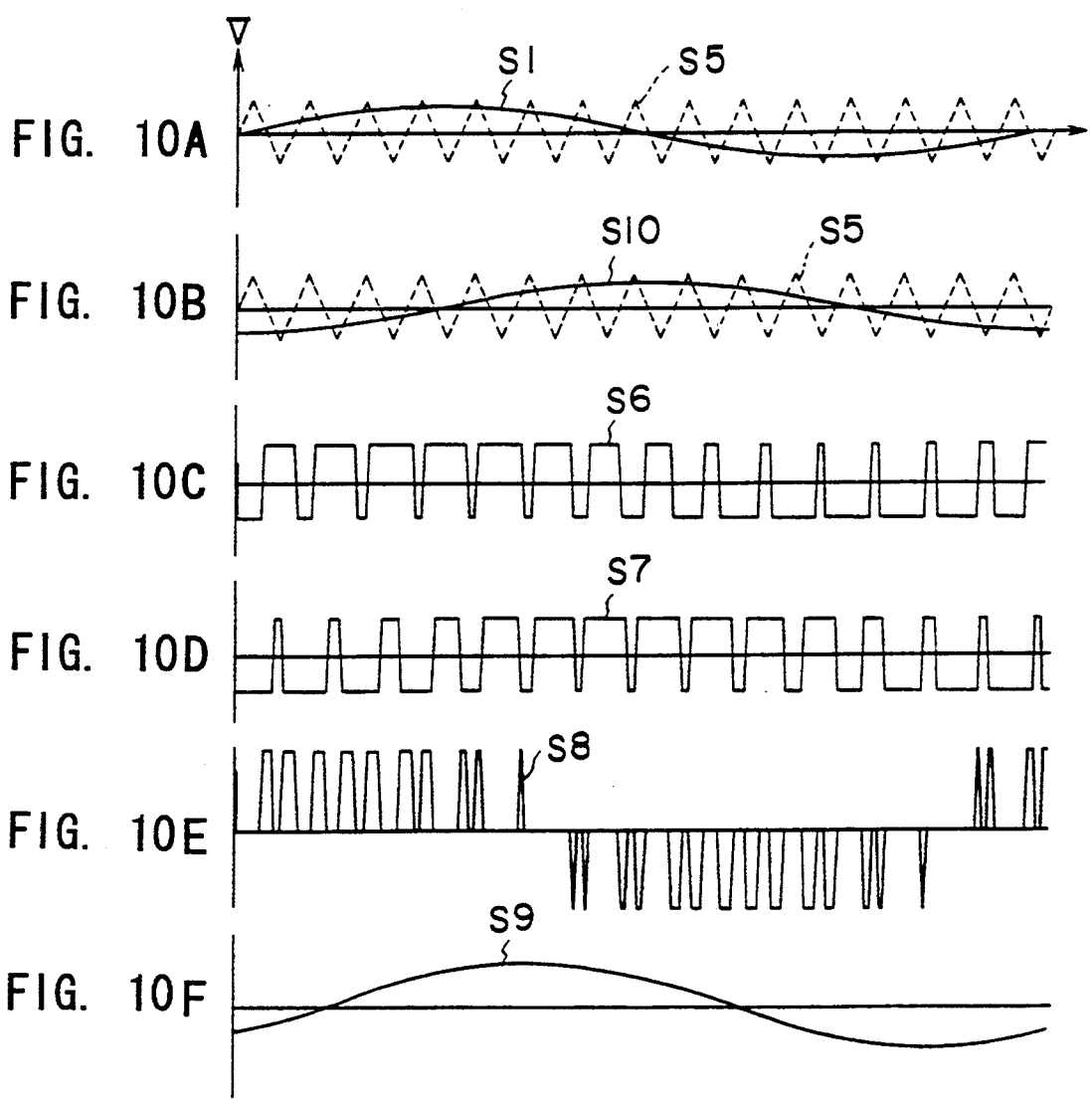

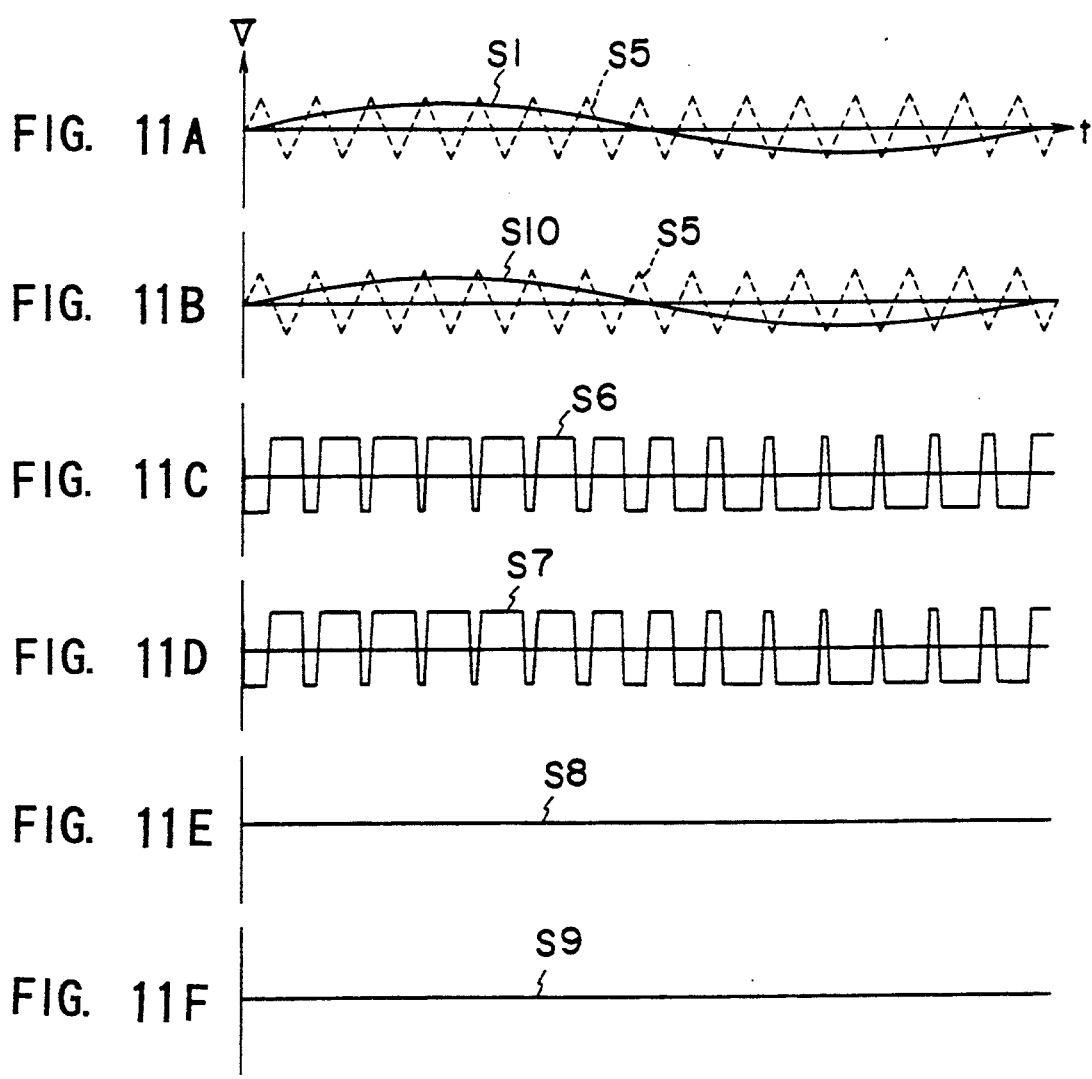

OUTPUT CIRCUIT CAPABLE OF DRIVING A VIBRATION DEVICE

BACKGROUND OF THE INVENTION

1. Field of the Invention

This invention relates to an output circuit, and more particularly to an improvement of an output circuit used for a pulse driven type hearing aid which applies a predetermined pulse to the earphone of the hearing aid to drive an earphone, for example.

2. Description of the Related Art

It has been proposed in the past in pulse driven type hearing aids that an earphone is driven by the pulse signal after an audio signal which is input from a microphone is modulated by the pulse width modulation system (PWM) into a pulse signal, the frequency of which is higher than the frequency band of the audio signal.

In this type of hearing aid, the distortion of a signal to be generated when an audio signal is amplified is reduced so that sound with less distortion can be obtained from the earphone.

In addition, in this type of hearing aid, the output circuit can be constituted by a switching circuit using transistors. In this way, the circuit configuration of the output circuit can be simplified and at the same time the output circuit can be operated at a low power supply voltage.

A typical configuration of this type of hearing aid is shown in "An output amplifier whose time has come," HEARING INSTRUMENTS, VOLUME 39, NO. 10, 1988.

That is, in this hearing aid, as shown in FIG. 1, an audio input signal S1 obtained by a microphone (not shown) is input into an output circuit 2 through an input terminal 1.

The output circuit 2 modulates the audio input signal S1 into a pulse signal S2, the duty ratio of which is proportional to the amplitude at each point of the above audio input signal S1 (hereafter referred to as "instantaneous amplitude"), supplies the pulse signal S2 to an earphone 3, and drives it. In this way, an audio output signal S3 can be obtained.

That is, the output circuit 2 forms a pulse signal S2 such as shown in FIG. 2B and outputs it to the earphone 3 in accordance with the instantaneous amplitude of this audio input signal S1 when an audio input signal S1, such as shown in FIG. 2A, is input. The earphone 3 emits the audio output signal S3 such as shown in FIG. 2C into the external auditory canal in accordance with this pulse signal S2.

However, in this output circuit 2, as shown in FIGS. 2A and 2B, in cases where the audio input signal S1 is not input (that is, even in cases where the instantaneous amplitude of the audio input signal S1 is zero level), the pulse signal S2, having the duty ratio of 50%, is still generated. When this pulse signal S2 is applied to the earphone 3, the output circuit 2 consumes the same power as when the amplitude is large, even when the amplitude is small. This type of output circuit was insufficient in the point of power consumption.

As a method of solving such a problem, it is possible to consider the reduction of power consumption by separating the positive portion of the amplitude of the audio input signal from the negative portion by providing a rectifier circuit, applying a positive pulse to the positive portion and a negative pulse to the negative portion, and not applying a pulse at no-signal.

However, there is a problem in this method that the tone quality is greatly deteriorated because crossover distortion is generated by the voltage offset of a rectifier circuit, etc., especially when the signal level of the input audio signal is low. It is therefore necessary to form a complicated circuit configuration or provide an adjustment circuit to avoid that. As a result, the circuit scale becomes larger and the manufacturing cost increases. Therefore, it is difficult to use, especially, in the small equipment as a hearing aid.

SUMMARY OF THE INVENTION

In view of the foregoing, an object of this invention is to provide an output circuit with a comparatively simple configuration that can reduce power consumption.

The foregoing object and other objects of the invention have been achieved by the provision of an output circuit 10 which generates a drive signal S8 in pulse form in accordance with the input signal S1 and drives a predetermined vibration means 16 in accordance with the drive signal S8 comprises: an oscillation means 15 for outputting an output signal S5 in triangular waveform or in sawtooth waveform, the frequency of which is higher than the frequency band of the input signal S1; a polarity inversion means 13 for inverting the polarity of the input signal S1 and outputs it as an inverted input signal S4; a first comparison means 12 for comparing the instantaneous level of the input signal S1 with that of the output signal S5 from the oscillation means 15; a second comparison means 14 for comparing the instantaneous level of the inverted input signal S4 with that of an output signal S5 from the oscillation means 15; and a pulse application means 17 for applying a pulse signal S8 of positive or negative potential to the vibration means 16 for a period of time in which the instantaneous level of the input signal S1 is higher than the output signal S5 of the oscillation means 15 and the instantaneous level of the inverted input signal S4 is lower than the output signal S5 of the oscillation means 15 in accordance with the results of comparison S6 and S7 using the first and second comparison means 12 and 14, and applies a pulse signal S8 of negative or positive potential to the vibration means 16 for a period of time in which the instantaneous level of the input signal S1 is lower than the output signal S5 of the oscillation means 15 and the instantaneous level of the inverted input signal S4 is higher than the output signal S5 of the oscillation means 15.

In addition, the first comparison means 12 and/or second comparison means 14 consists of a voltage comparator 12 or 14 which compares the input signal S1 or the inverted input signal S4 with the output signal S5 of the oscillation means 15.

In addition, the first comparison means 12 and/or second comparison means 14 consists of an adder circuit 61 or 63 which adds the input signal S1 or the inverted input signal S4 and the output signal S5 of the oscillation means 15, and a zero-level comparator 62 or 64 which compares the add output S11 or S12 of the adder circuit 61 or 63 with the zero level.

In addition, the first and second comparison means 12 and 14 output positive or negative pulse signals S6 and S7 in accordance with the result of comparison and the pulse application means 17 applies pulse signals S6 and S7 which are output from the first and second comparison means 12 and 14 to the positive and negative terminals of an earphone 16 or a speaker, respectively.

In addition, the oscillation means 15 is an amplitude adjustable type which varies the amplitude of the output signal S5 and the amplitude of the vibration means 16 is controlled by changing the amplitude of the output signal S5.

Furthermore, the polarity inversion means 13 consists of a phase-shifting circuit 50 and the amplitude of the vibration means 16 is controlled by changing the phase-shifting amount of the phase-shifting circuit 50.

An output circuit 10 which can considerably reduce power consumption can be obtained by providing a polarity inversion means 13 for inverting the polarity of the input signal S1 and outputting it as an inverted input signal S4, comparing the instantaneous level of the input signal S1 with that of the output signal S5 from the oscillation means 15 by a first comparison means 12, comparing the instantaneous level of the inverted input signal S4 with that of an output signal S5 from the oscillation means 15 by a second comparison means 14, and thereafter, applying a pulse signal S8 of positive or negative potential to the vibration means 16 for a period of time in which the instantaneous level of the input signal S1 is higher than the output signal S5 of the oscillation means 15 and the instantaneous level of the inverted input signal S4 is lower than the output signal S5 of the oscillation means 15 in accordance with the comparison results S6 and S7, as well as applying a pulse signal S8 of negative or positive potential to the vibration means 16 for a period of time in which the instantaneous level of the input signal S1 is lower than the output signal S5 of the oscillation means 15 and the instantaneous level of the inverted input signal S4 is higher than the output signal S5 of the oscillation means 15, thus enabling to obtain the formation of a drive signal S8 having a duty ratio corresponding to the instantaneous amplitude of the input signal S1 can.

In addition, if an amplitude adjustable type which can change the amplitude of an output signal S5 is used as an oscillation means 15, the amplitude of the vibration means 16 can be controlled by changing the amplitude of the output signal S5. In this way, the number of parts can be reduced for the portion where the gain adjustment circuit can be omitted.

Similarly, if the polarity inversion means 13 is constituted by a phase-shifting circuit 50, the amplitude of the vibration means 16 can be controlled by changing the phase-shifting amount of the phase-shifting circuit 50. In this way, the number of parts can be reduced for the portion where the gain adjustment circuit can be omitted.

According to the invention, an output circuit with a comparatively simple configuration which can drive a vibration means at high efficiency without consuming unnecessary power can be realized by providing a polarity inversion means for inverting the polarity of an input signal and outputting it as an inverted input signal, comparing the instantaneous level of the input signal with that of the output signal from an oscillation means by a first comparison means, comparing the instantaneous level of the inverted input signal with that of an output signal from the oscillation means by a second comparison means, and thereafter obtaining the formation of a drive signal having a duty ratio corresponding to the instantaneous amplitude of the input signal, when a pulse signal of positive or negative potential is applied to the vibration means for a period of time in which the instantaneous level of the input signal is higher than the output signal of the oscillation means and the instantaneous level of the inverted input signal is lower than the output signal of the oscillation means in accordance with the comparison results, as well as when a pulse signal of negative or positive potential is applied to the vibration means for a period of time in which the instantaneous level of the input signal is lower than the output signal of the oscillation means and the instantaneous level of the inverted input signal is higher than the output signal of the oscillation means.

In addition, according to the invention, since a vibration means is formed in an amplitude variable type, control of the amplitude of a vibration means can be obtained by changing the amplitude of an output signal from the oscillation means. In this way, a complicated gain regulator circuit can be omitted, resulting in a reduction in the number of components.

Similarly, according to the invention, since the polarity inversion means is constituted of a phase-shifting circuit, control of the amplitude of the vibration means can be obtained by changing the phase-shifting amount of the phase-shifting circuit. In this way, the gain regulator circuit can be omitted, resulting in a reduction in the number of components.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 10A to 10F are signal waveform diagrams explaining the operation in cases where the phase-shifting amount is set at 90 degrees;

FIGS. 11A to 11F are signal waveform diagrams explaining the operation in cases where the phase-shifting amount is set at 0 degrees;

DETAILED DESCRIPTION OF THE EMBODIMENT

Preferred embodiments of this invention will be described with reference to the accompanying drawings:

(1) General Configuration

Figure 3:
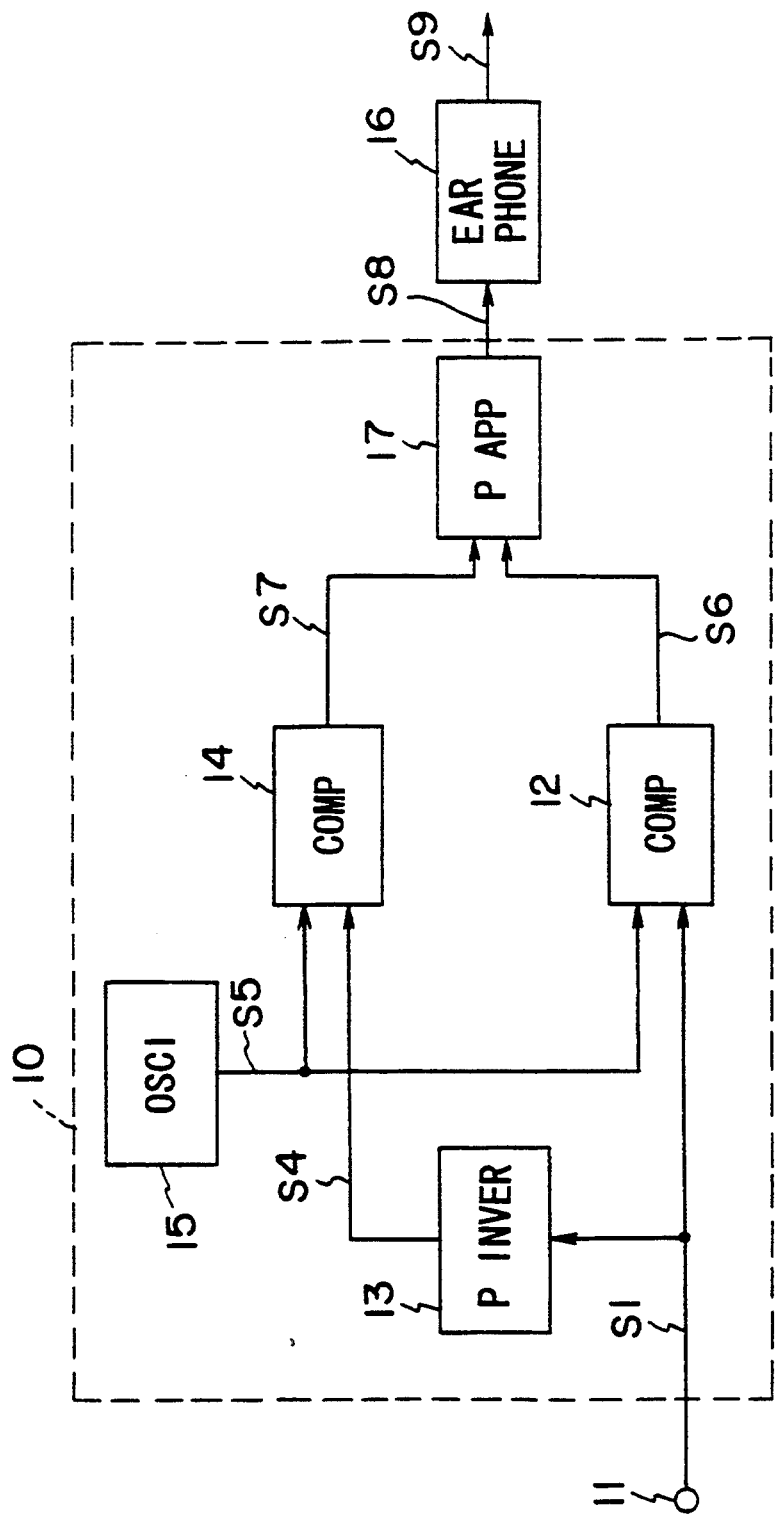
FIG. 3 is a block diagram illustrating an embodiment of an output circuit according to this invention.

In FIG. 3, 10 shows an overall output circuit of a hearing aid. An audio input signal S1 which is obtained by a microphone (not shown) is sent to a first comparator circuit 12 and a polarity inverter circuit 13 through an input terminal 11.

The polarity inverter circuit 13 inverts the polarity of the audio input signal S1, that is, an inverted input signal S4 is formed by shifting the phase of the audio input signal S1 by 180 degrees, and this is sent to a second comparator circuit 14.

An oscillator circuit 15 generates a triangular wave having a predetermined frequency and a predetermined amplitude and sends the triangular wave to the first and second comparator circuits 12 and 14 as an oscillator circuit signal S5.

In this way, the first comparator circuit 12 compares the audio input signal S1 with the oscillator circuit signal S5, forms a comparison signal S6 in pulse form, and outputs it to the pulse application circuit 17. At the same time, the second comparator circuit 14 compares the inverted input signal S4 with the oscillator circuit signal S5, forms a comparison signal S7 in pulse form, and sends it to the pulse application circuit 17.

The pulse application circuit 17 generates a drive signal S8 in pulse form, the level of which becomes high for a period of time in which the potential of the comparison signal S6 is high and the potential of the comparison signal S7 is low and becomes low for a period of time in which the potential of the comparison signal S6 is low and the potential of the comparison signal S7 is high, and sends the drive signal S8 to the earphone 16.

The earphone 16 outputs an audio output signal S9 in accordance with the drive signal S8.

(2) Circuit configuration

Figure 4:
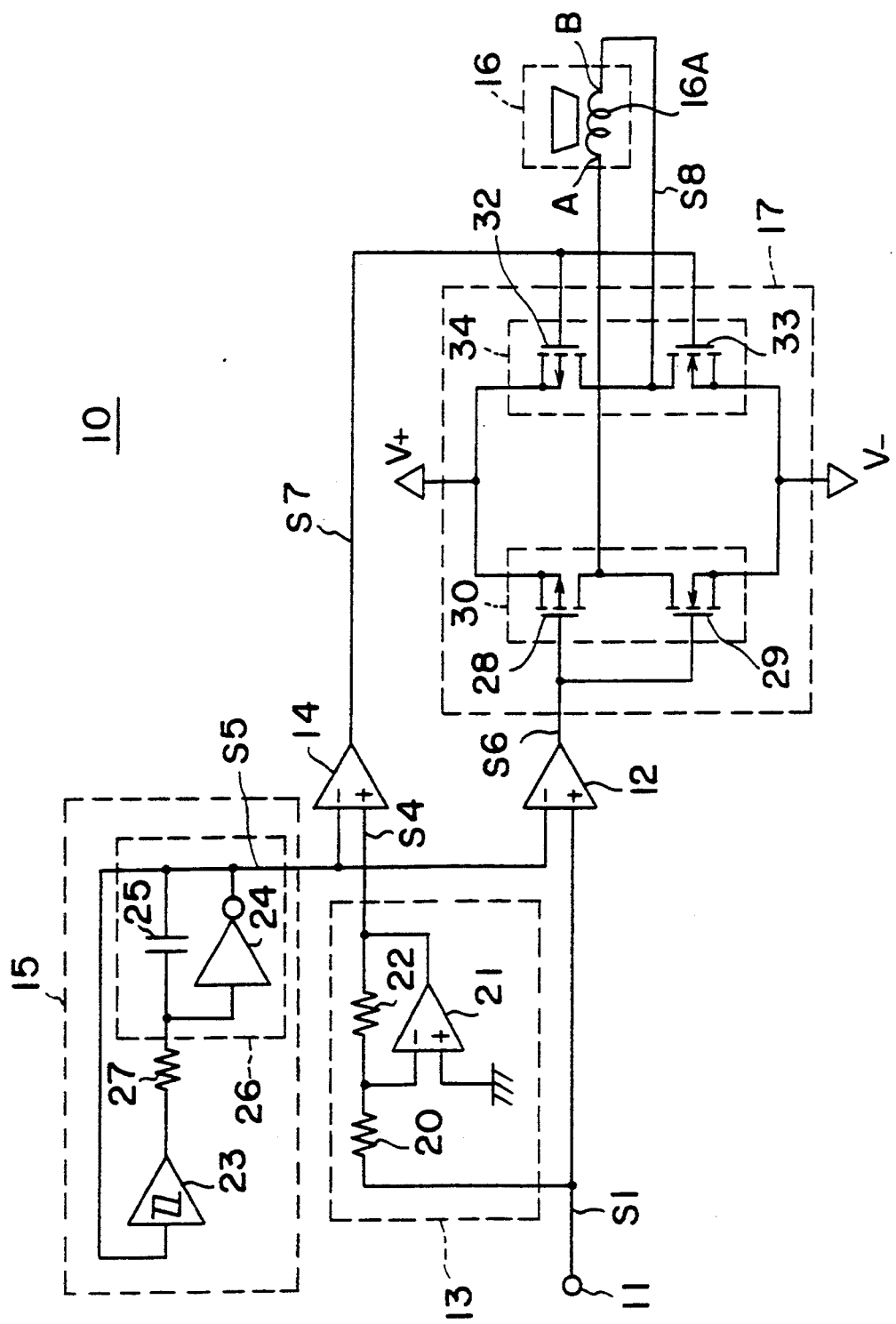
FIG. 4 is a connection diagram illustrating an output circuit according to the embodiment.

In FIG. 4, in which identical symbols are given in illustrating parts which correspond to those of FIG. 3, in the output circuit 10, the input terminal 11 which is connected with the output of a microphone (not shown) is connected with the non-inverting input of the first comparator circuit 12.

In addition, the input terminal 11 is connected with the inverting input of an operational amplifier 21 of the polarity inverter circuit 13, in which the non-inverting input is grounded, through an input resistance 20. The output of the operational amplifier 21 is connected with the inverting input of the operational amplifier 21 through a feedback resistance 22. The input resistance 20, feedback resistance 22, and operational amplifier 21 constitute a polarity inverter circuit 13 as a whole. In addition, the output of the operational amplifier 21 is connected with the non-inverting input of the second comparator circuit 14.

Figure 5:
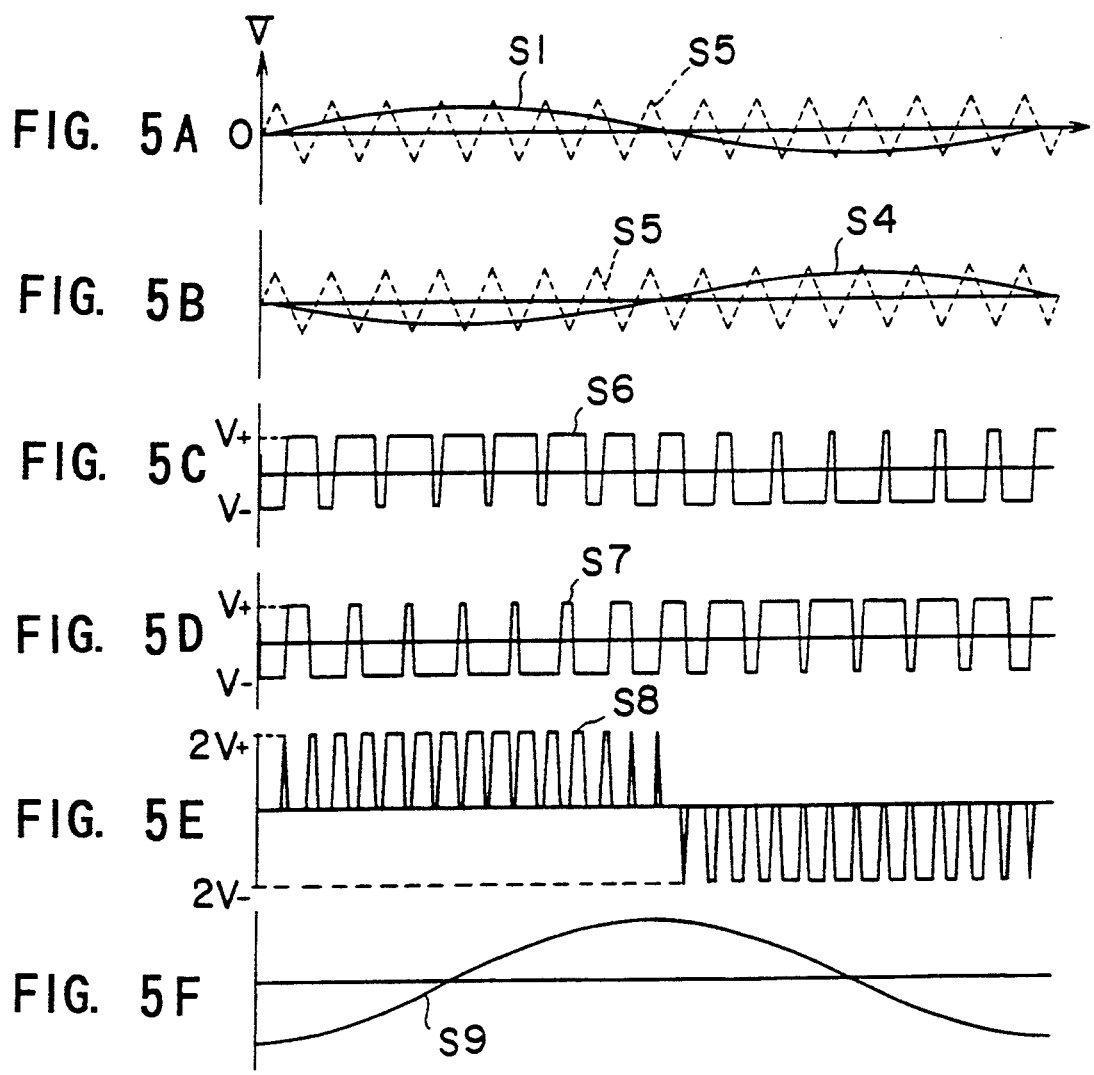
FIGS. 5A to 5F are signal waveform diagrams explaining the operation of the embodiment.

The resistance values of the input resistance 20 and the feedback resistance 22 are set equally so that the inverted input signal S4 in which the amplification factor is "1" and the phase of which is opposite to the input signal S1 (FIG. 5A) is output from the output of the operational amplifier 21, such as shown in FIG. 5B.

In the oscillator circuit 15, a hysteresis comparator 23 is connected with an integration circuit 26, in which an inverter 24 and a capacitor 25 are connected in parallel, through a resistance 27.

That is, the oscillator circuit 15 applies a square-wave output signal which is output from the hysteresis comparator 23 to the integration circuit 26 through the resistance 27, and the integration circuit 26 generates a triangular wave of predetermined frequency from this square-wave.

The output of the integration circuit 26 is connected with the input of the hysteresis comparator 23 and is also connected with the inverting inputs of the first and second comparator circuits 12 and 14. In this way, the integration circuit 26 feeds back the generated triangular wave to the input of the hysteresis comparator 23 and also supplies it to the inverting inputs of the first and second comparator circuits 12 and 14.

In the cases of embodiment, it is arranged such that the oscillator circuit 15 generates a triangular wave oscillator circuit signal S5, the frequency of which is as high as nearly 100 [kHz] compared with the frequency of the sound input signal S1 and which amplitude is greater than that of the sound input signal S1.

In this way, the first comparator circuit 12 compares the voltage of the audio input signal S1 with that of the oscillator circuit signal S5, such as shown in FIG. 5A. As a result, the first comparator circuit 12 outputs a comparison signal S6, the potential of which becomes high for a period of time in which the voltage of the audio input signal S1 is higher than that of the oscillator circuit signal S5 and becomes low for a period of time in which the voltage of the audio input signal S1 is lower than that of the oscillator circuit signal S5, as shown in FIG. 5C.

Similarly, the second comparator circuit 14 compares the voltage of the inverted input signal S4 with that of the oscillator circuit signal S5, such as shown in FIG. 5B. As a result, the second comparator circuit 14 outputs a comparison signal S7, the potential of which becomes high for a period of time in which the voltage of the inverted input signal S4 is higher than that of the oscillator circuit signal S5 and becomes low for a period of time in which the voltage of the inverted input signal S4 is lower than that of the oscillator circuit signal S5, as shown in FIG. 5D.

That is, the first and second comparator circuits 12 and 14 compare the audio input signal S1 and the inverted input signal S4 with the oscillator circuit signal S5, form a pulse train having a pulse width proportional to the size of each signal of the audio input signal S1 and the inverted input signal S4, and modulates the audio input signal S1 and the inverted input signal S4, respectively, by the pulse width.

The output of the first comparator circuit 12 is connected with the Gate of a P-channel MOS field-effect transistor (hereafter called "P-channel MOS FET") 28 and the gate of an N-channel MOS FET 29.

In addition, the drain of the P-channel MOS FET 28 and the drain of the N-channel MOS FET 29 are connected with each other. In this way, the P-channel MOS FET 28 and the N-channel MOS FET 29 form a CMOS (Complementary MOS) inverter circuit 30. The CMOS inverter circuit 30 switches the conducting states of the P-channel MOS FET 28 and the N-channel MOS FET 29 in accordance with the output voltage of the first comparison circuit 12 to supply a predetermined voltage to one end A of the coil 16A of the earphone 16.

In addition, the output of the second comparator circuit 14 is connected with the gate of a P-channel MOS FET 32 and the gate of an N-channel MOS FET 33.

In addition, the drain of the P-channel MOS FET 32 and the drain of the N-channel MOS FET 33 are connected with each other. In this way, the P-channel MOS FET 32 and the N-channel MOS FET 33 form a CMOS inverter circuit 34. The CMOS inverter circuit 34 switches the conducting states of the P-channel MOS FET 32 and the N-channel MOS FET 33 in accordance with the output voltage of the second comparator circuit 14 to apply a predetermined voltage to one end B of the coil 16A of the earphone 16.

Thus, the CMOS inverter circuits 30 and 34 form a pulse application circuit 17 and send a drive signal S8 to the earphone 16.

That is, in the CMOS inverter circuit 30, in cases where the potential of the comparison signal S6 which is output from the first comparator circuit 12 is high, the conduction state between the drain and source of the N-channel MOS FET 29 becomes conductive and the P-channel MOS FET 28 enters the cut-off state. As a result, a voltage which is nearly equal to the supply voltage $V-$ is applied to one end A of the coil 16A.

Contrariwise, in the CMOS inverter circuit 30, in cases where the potential of the comparison signal S6 which is output from the first-comparator circuit 12 is low, the conduction state between the drain and source of the P-channel MOS FET 28 becomes conductive and the N-channel MOS FET 29 enters the cut-off state. As a result, a voltage which is nearly equal to the supply voltage $V+$ is applied to one end A of the coil 16A.

In addition, in the CMOS inverter circuit 34, in cases where the potential of the comparison signal S7 which is output from the second comparator circuit 14 is high, the conduction state between the drain and source of the N-channel MOS FET 33 becomes conductive and the P-channel MOS FET 32 enters the cut-off state. As a result, a voltage which is nearly equal to the supply voltage $V-$ is applied to one end B of the coil 16A.

Contrary to this, in the CMOS inverter circuit 34, in cases where the potential of the comparison signal S7 which is output from the second comparator circuit 14 is low, the conduction state between the drain and source of the P-channel MOS FET 32 becomes conductive and the N-channel MOS FET 33 enters the cut-off state. As a result, a voltage which is nearly equal to the supply voltage $V+$ is applied to one end B of the coil 16A.

As a result, the pulse application circuit 17 sends a drive signal S8 with the voltage of $2 V+$, when one end A is taken as a reference, to the earphone 16, as shown in FIGS. 5C through 5E, for a period of time in which the potential of the comparison signal S6 which is output from the first comparator output 12 is high and the potential of the comparison signal S7 which is output from the second comparator circuit 14 is low.

On the contrary, the pulse application circuit 17 sends a drive signal S8 with the voltage of $2 V-$ to the earphone 16 for a period of time in which the potential of the comparison signal S6 which is output from the first comparator circuit 12 is low and the potential of the comparison signal S7 which is output from the second comparator circuit 14 is high.

In addition, the pulse application circuit 17 sends a drive signal S8, the voltage of which is zero level, to the earphone 16 when comparison signals S6 and S7 are output in other combinations from the first and second comparator circuits 12 and 14, that is, when the potentials of the comparison signals S6 and S7 which are output from the first and second comparator circuits 12 and 14 are both high, or when the potentials of the comparison signals S6 and S7 which are output from the first and second comparator circuits 12 and 14 are both low. In this way, in the output circuit 10, the power consumption can be reduced for this portion.

(3) Operation of Embodiment

In the above configuration, the output circuit 10 inputs an audio input signal S1 into the first comparator circuit 12, inverts the phase of the audio input signal S1 by the polarity inverter circuit 13, and then inputs it into the second comparator circuit 14.

The first and second comparator circuits 12 and 14 compare the audio input signal S1 and the inverted input signal S4 with the triangular wave oscillator circuit signal S5, respectively, sent from the oscillator circuit 15, as shown in FIGS. 5A and 5B, modulates the audio input signal S1 and the inverted input signal S4 by pulse width, and sends the comparison signals S6 and S7 of pulse wave to the pulse application circuit 17, which is based on the instantaneous amplitudes of the audio input signal S1 and the inverted input signal S4.

The pulse application circuit 17 outputs to the earphone 16, based on the potential difference at each point of the comparison signals S6 and S7, a drive signal S8 which becomes the positive voltage of $2 V+$ when the potential of the comparison signal S6 is high and the potential of the comparison signal S7 is low $V-$, the negative voltage of $2 V-$ when the potential of the comparison signal S6 is low and the potential of the comparison signal S7 is high $V+$, and zero level when the potentials of the comparison signals S6 and S7 are both high or when the potentials of the comparison signals S6 and S7 are both low, such as shown in FIG. 5E.

The earphone 16 is driven based on the drive signal S8 and outputs an audio output S9 responding to the integrated value of the drive signal S8, as shown in FIG. 5F.

Thus, the output circuit 10 can reduce the duty ratio of the drive signal S8 with the instantaneous amplitude of the audio input signal S1 made smaller by sending the drive signal S8 responding to the instantaneous amplitude of the audio input signal S1 to the earphone 16. As a result, the output circuit 10 can drive the earphone 16 effectively without consuming unnecessary power.

Figure 6:
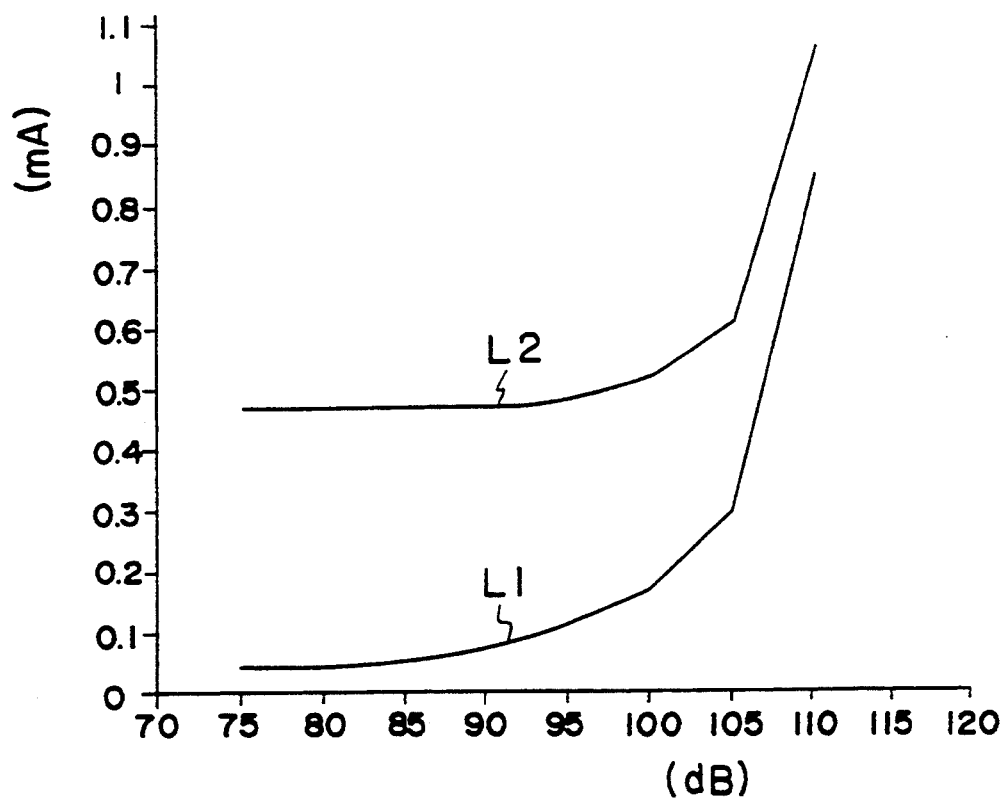
FIG. 6 is a characteristic curve showing an experimental result according to the embodiment.

According to the experiments, in cases where a sinewave of 1600 [Hz] is input to the output circuit 10 of the embodiment and a conventional pulse-driven output circuit 2, respectively, and when the current consumption of the output circuit 10 of the embodiment shown in a current consumption curve L1 is compared with the current consumption of a conventional output circuit 2 shown in a power consumption curve L2, as shown in FIG. 6, there is no big difference in the power consumption when the output sound pressure from the earphone 16 is as big as 10 [dBSPL], for example, but the current consumption of the output circuit 10 of the embodiment is 0.04 [mA] while the current consumption of the conventional output circuit 2 is 0.47 [mA] when the output sound pressure is as small as, for example, 75 [dBSPL]. The current consumption of the output circuit 10 of the embodiment became one tenth or below the current consumption of the conventional output circuit 2. Thus, it is understood that the output circuit 10 can reduce the power consumption effectively, especially when an input signal having a small amplitude is input.

(4) Effects of Embodiment

According to the above configuration, an output circuit 10 with a comparatively simple configuration which can drive the earphone 16 at high efficiency without consuming unnecessary power can be realized by providing a polarity inverter circuit 13 which inverts the phase of a sound input signal S1, and by forming the comparison signals S6 and S7 in which the sound input signal S1 and the inverted input signal S4 are modulated, respectively, by pulse width by comparing the inverted signal S4 which is output from the polarity inverter circuit 13 and the sound input signal S1 with the oscillator circuit signal S5 which is output from the oscillator circuit 15 by the first and second comparator circuits 12 and 14, respectively, and thereafter, thus obtaining the drive signal S8 having a duty ratio responding to the instantaneous amplitude of the sound input signal S1 by forming the drive signal S8 in accordance with the comparison signals S6 and S7 by the pulse application circuit 17.

(5) Another Embodiments (5-1) Furthermore, in the above embodiment, the case in which the oscillation circuit 15 sends an oscillator circuit signal S5 having a predetermined amplitude in triangular waveform has been described. However, this invention is not only limited to this, but the same effect as the above case can also be obtained in cases where the oscillator circuit 15 generates an oscillator circuit signal in saw-tooth wave form.

Figure 7:
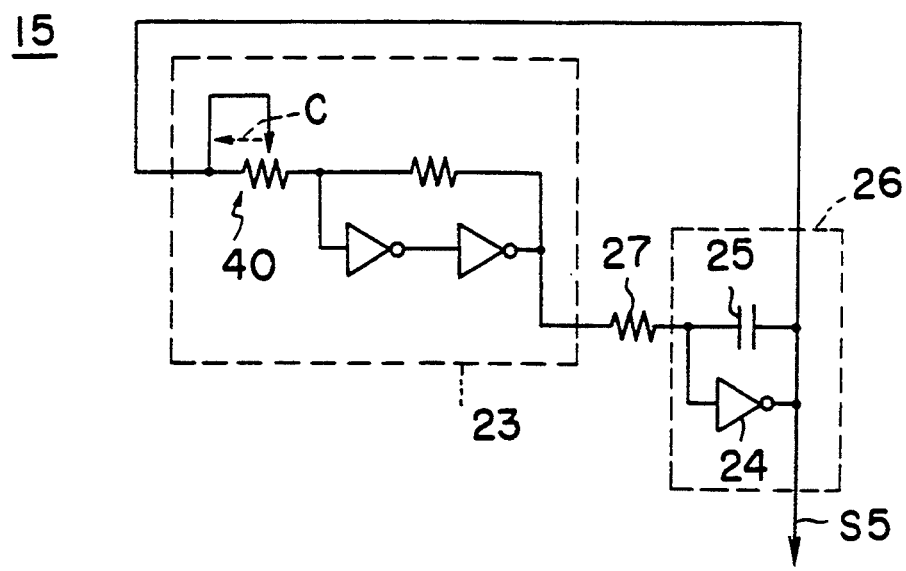
FIG. 7 is a connection diagram illustrating an oscillation circuit according to another embodiment.
Figure 8:
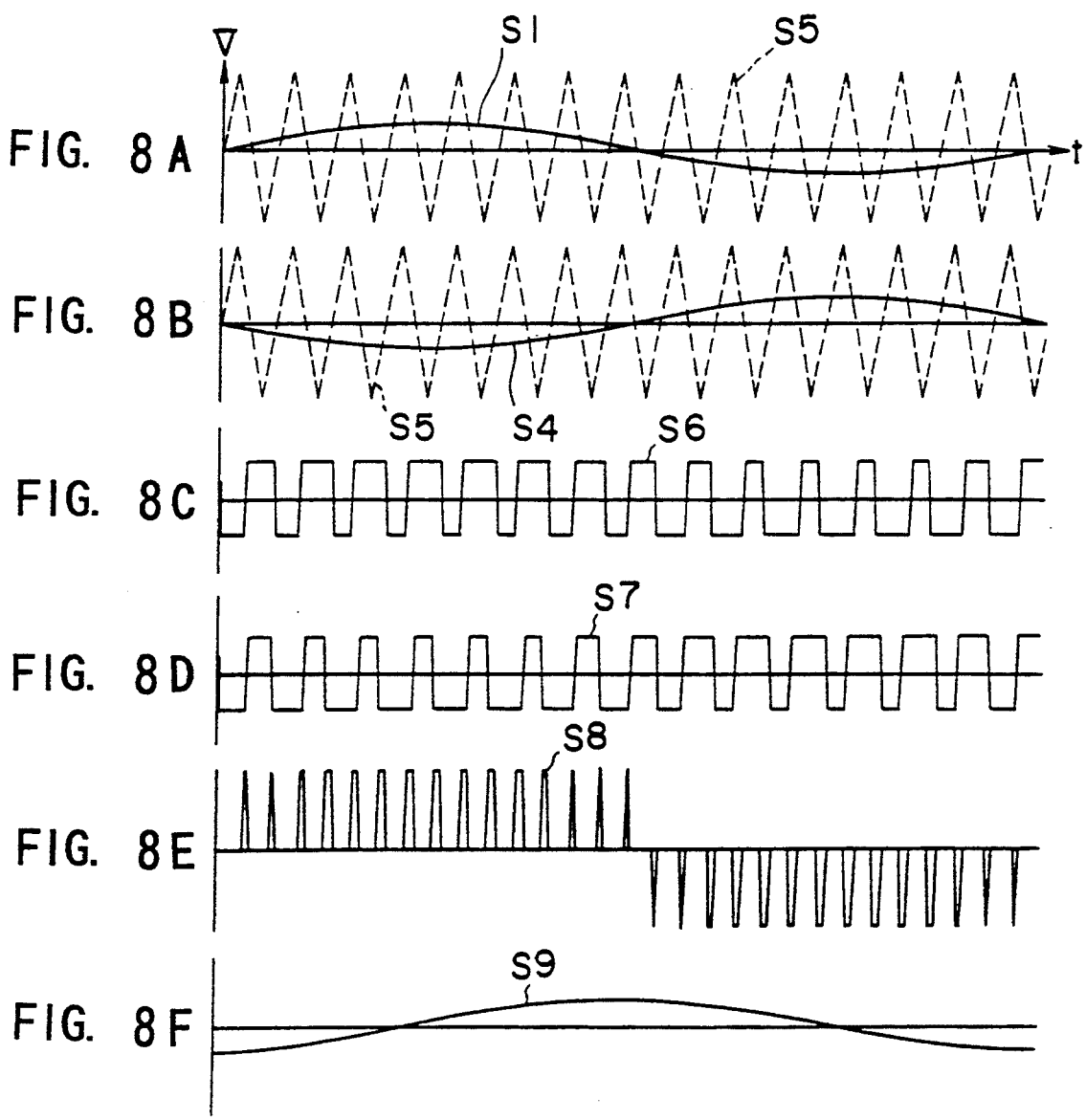
FIGS. 8A to 8F are signal waveform diagrams explaining the operation in cases where the amplitude of an oscillator circuit signal is made greater.

In addition, in the above embodiment, the case in which the oscillator circuit 15 sends an oscillator circuit signal S5 having a predetermined amplitude in triangular waveform was described. However, this invention is not only limited to this, but may also be arranged such that a variable resistance 40 is provided in the hysteresis comparator circuit 23 of the oscillator circuit 15, as shown in FIG. 7.

In this case, when the slider of the variable resistance 40 of the oscillator circuit 15 is slid in the direction indicated by arrow C, a triangular wave oscillator circuit signal S5 having a large amplitude can be generated. Therefore, the pulse application circuit 17 generates a drive signal S8 having a small duty ratio over the entire signal in accordance with the comparison signals S6 and S7 output from the first and second comparator circuits 12 and 14. As a result, a sound output S9 having a small sound-pressure level is output from the earphone 16.

On the contrary, if the slider of the variable resistance 40 is slid in the direction opposite to that indicated by arrow C, a triangular wave oscillator circuit signal S5 having a small amplitude can be generated. Therefore, the pulse application circuit 17 generates a drive signal S8 having a large duty ratio over the entire signal. As a result, a sound output S9 having a large sound-pressure level is output from the earphone 16.

Thus, the output circuit 10 can adjust the sound-pressure level of the sound output by adjusting the amplitude of the oscillator circuit signal S5 which is output from the oscillator circuit 15.

Figure 9:
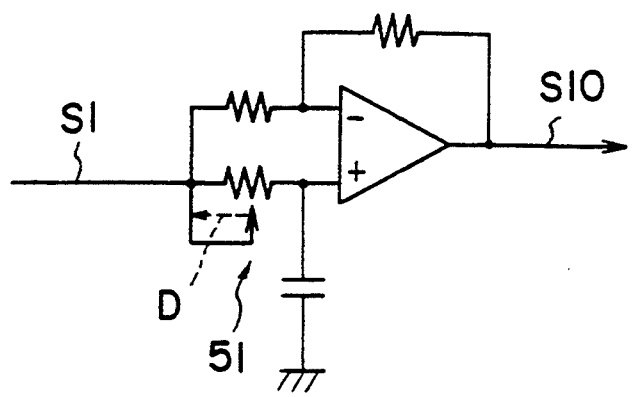
FIG. 9 is a connection diagram illustrating a phase-shifting circuit according to another embodiment.

(5-2) In addition, in the above embodiment, the case where the phase of the sound input signal S1 is inverted by the polarity inverter circuit 13 was described. However, this invention is not only limited to this, but may also be arranged such that a phase-shifting circuit 50 is provided in place of the polarity inverter circuit 13, as shown in FIG. 9.

The phase-shifting circuit 50 has a variable resistance 51 and is arranged so as to be able to change the phase-shifting amount of the phase-shifting signal S10 by sliding the slider of the variable resistance 51.

That is, the phase-shifting circuit 50 is arranged so as to make the phase-shifting amount of the phase-shifting signal S10 for the sound input signal S1 greater in accordance with the slide in the direction indicated by arrow D of the slider of the variable resistance 51.

Figure 1:
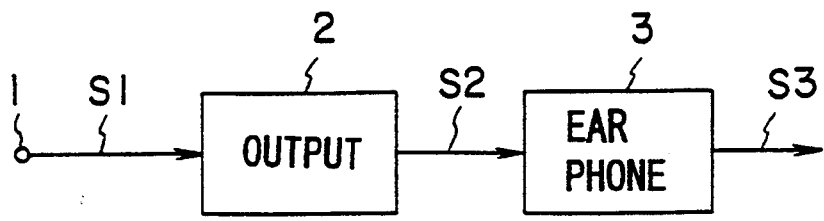
FIG. 1 is a block diagram illustrating a configuration of a hearing aid.
Figure 2A:
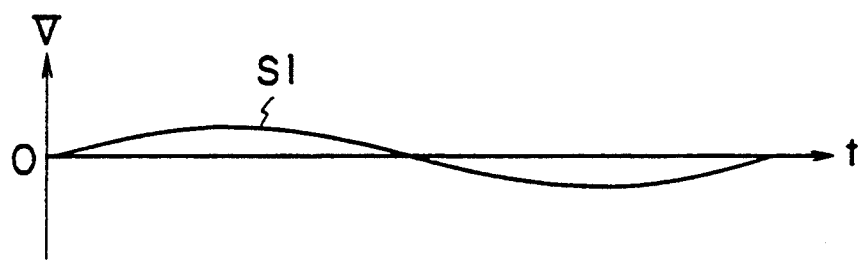
FIGS. 2A to 2C are signal waveform diagrams explaining the operation of a conventional output circuit.
Figure 2B:
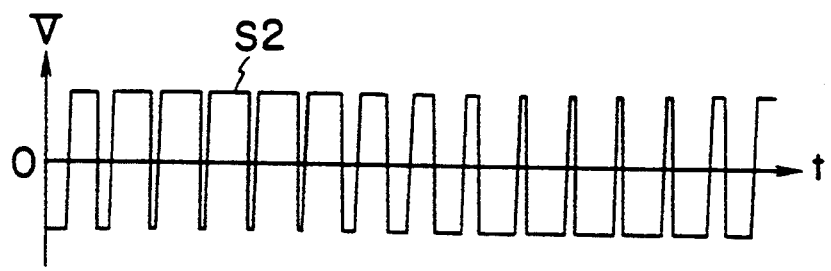
Figure 2C:
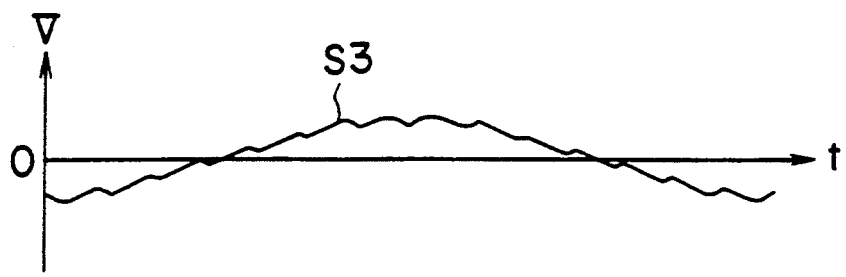

In this way, the output circuit 10 is arranged such that the same signal waveform (FIG. 1) as the above embodiment can be obtained in cases where a phase-shifting signal S10 having the phase-shifting amount of 180 degrees for the sound input signal S1 is sent from the phase-shifting circuit 50 to the second comparator circuit 14, for example. Contrary to this, the output circuit 10 is arranged such that a signal waveform such as shown in FIGS. 10A to 10F and FIG. 11A to 11F can be obtained and the sound-pressure level of the sound output S9 can be gradually made smaller in cases where a phase-shifting signal S10 having the phase-shifting amount of 90 degrees or 0 degrees for the sound input signal S1 is sent from the phase-shifting circuit 50 to the second comparator circuit 14.

Thus, the output circuit 10 can adjust the sound-pressure level of the sound output S9 by providing a phase-shifting circuit 50 in place of the polarity inverter circuit 13 and by adjusting the phase-shifting amount of the phase-shifting signal S10, which is sent to the second comparator circuit 14, by the phase-shifting circuit 50.

Figure 12:
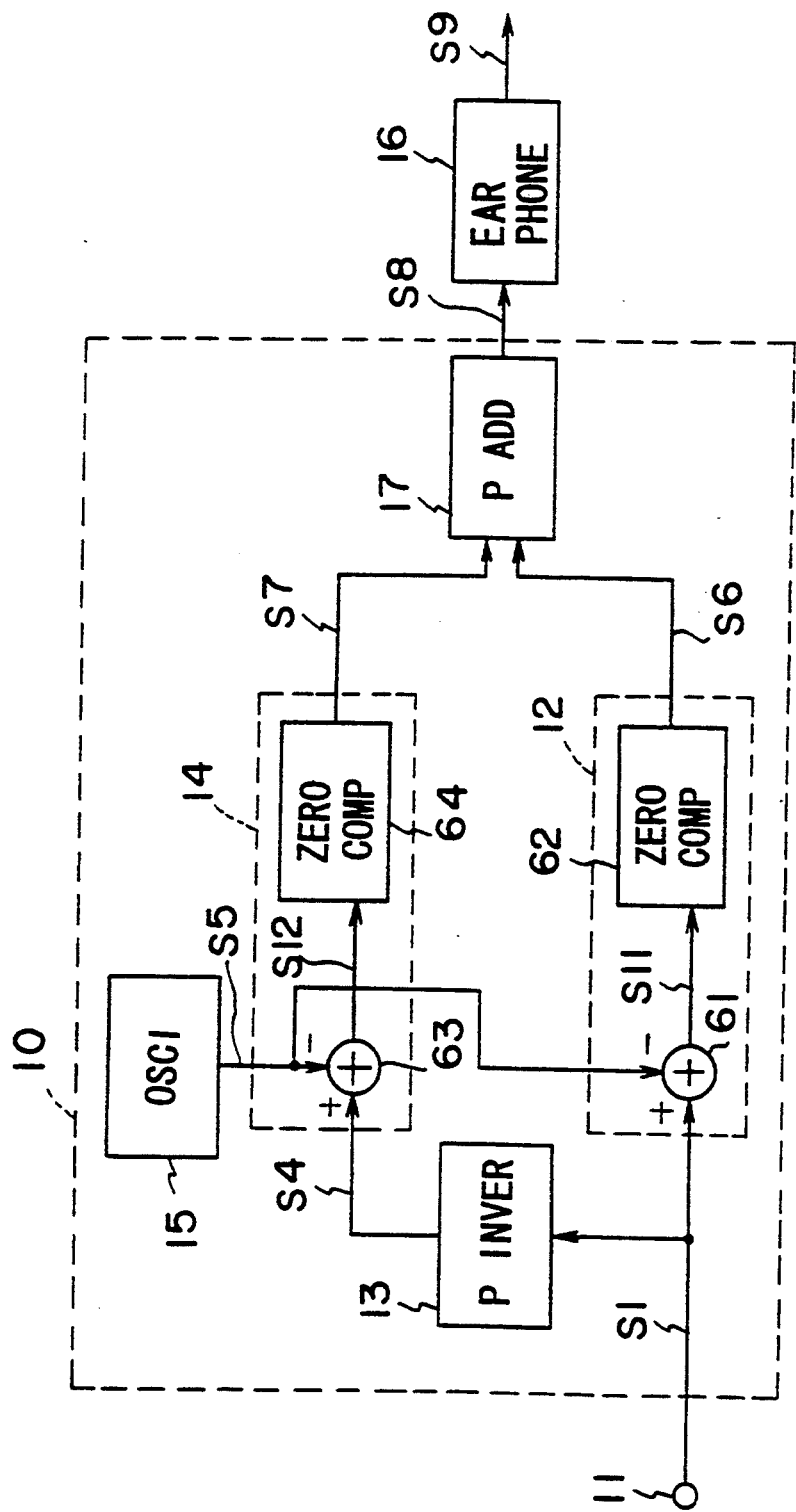
FIG. 12 is a block diagram illustrating an output circuit according to another embodiment.

(5-3) Further, in the above embodiment, the case where the first and second comparator circuits 12 and 14 are composed of a voltage comparator, the voltage of the sound input signal S1 and the voltage of the oscillator circuit signal S5 are compared by the first comparator circuit 12, and the voltage of the inverted input signal S4 and the voltage of the oscillator circuit signal S5 are compared by the second comparator circuit 14, was described. However, this invention is not only limited to this, but may also be arranged such that the first comparator circuit 12 is composed of an adder circuit 61 and a zero-level comparator 62, and the second comparator circuit 14 is composed of an adder circuit 63 and a zero-level comparator 64, as shown in FIG. 12.

In this case, the first comparator circuit 12 inputs the sound input signal S1 to the plus input pin of the adder circuit 61 while the oscillator circuit signal S5 to the minus input pin of the adder circuit 61 so as to subtract the oscillator circuit signal S5 from the sound input signal S1, and after that, the comparison signal S6 can be obtained in accordance with this adder signal S11 by the zero-level comparator 62. Similarly, the second comparator circuit 14 inputs the inverted input signal S4 to the plus input pin of the adder circuit 63 and the oscillator circuit signal S5 to the minus input pin of the adder circuit 63 so as to subtract the oscillator circuit signal S5 from the inverted input signal S4, and after that, the comparison signal S7 can be obtained in accordance with this adder signal S12 by the zero-level comparator 64.

Figure 13:
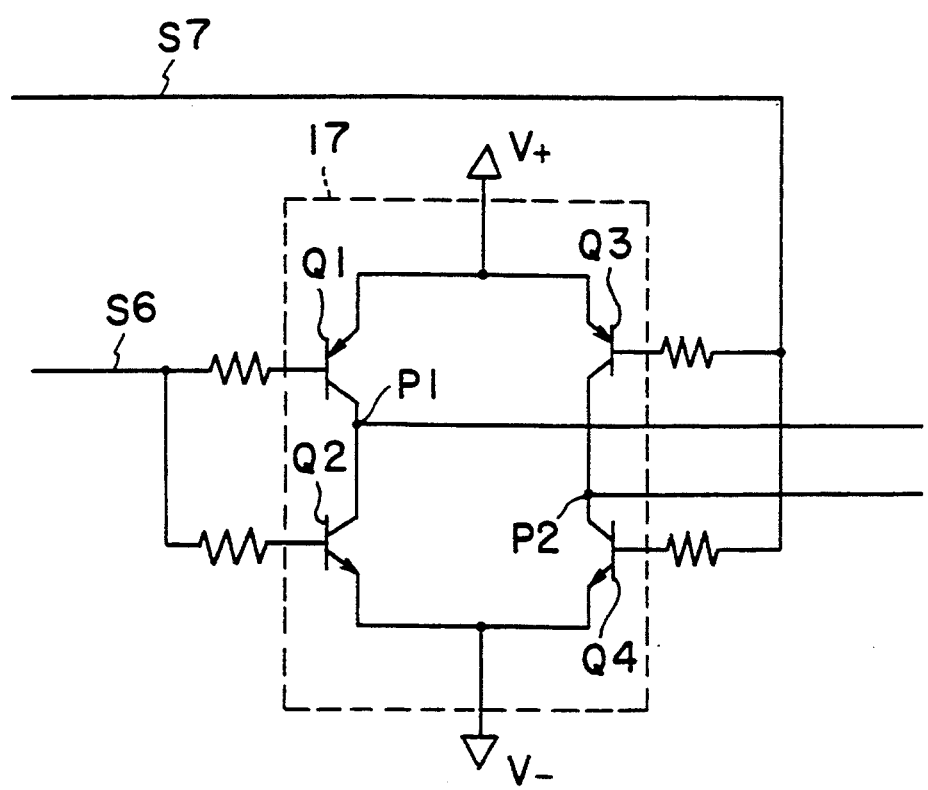
FIG. 13 is a connection diagram illustrating a pulse application circuit according to another embodiment.

(5-4) In addition, in the above embodiment, the case where the pulse application circuit 17 is composed of CMOS inverter circuits 30 and 34 has been described. However, this invention is not only limited to this, but even in cases where drive signals, which are obtained from the node P1 of a transistor Q1 and a transistor Q2 as well as the node P2 of a transistor Q3 and a transistor Q4, are applied to the earphone 16 by cascade connecting a PNP transistor Q1 and an NPN transistor Q2 as well as inputting the comparison signal S6 to each base electrode of the PNP transistor Q1 and the NPN transistor Q2, and by cascade connecting a PNP transistor Q3 and an NPN transistor Q4 and inputting the comparison signal S7 to each base electrode of the PNP transistor Q3 as well as the NPN transistor Q4, such as shown in FIG. 13, the same effect as the above case can be obtained.

That is, various configurations of the pulse application circuit can be applied, which can output a drive signal S8 to the earphone 16, such that the drive signal S8 becomes a negative potential or a positive potential for a period of time in which the potential of the comparison signal S6 is high and that of the comparison signal S7 is low, and the drive signal S8 becomes a negative potential or a positive potential for a period of time in which the potential of the comparison signal S6 is low and the potential of the comparison signal S7 is high, and the drive signal S8 becomes zero level for a period of time in which the potentials of the comparison signals S6 and S7 are both high or the potentials of the comparison signals S6 and S7 are both low.

(5-5) Furthermore, in the above embodiment, the case where the output circuit 10 according to the invention is used in a hearing aid has been described. However, this invention is not only limited to this, but can be widely applied to various kinds of acoustic equipment. In this case, the power consumption of acoustic equipment can be reduced considerably, similar to the above case, if it is arranged such that the output circuit 10 inputs a predetermined sound signal from the input terminal 11 and the drive signal S8 which is output from the pulse application circuit 17 is sent to a speaker, etc.

Furthermore, the output circuit 10 according to the invention may also be applied to an agitator, for example. That is, the invention can be applied to various pulse-driven output circuits in which a drive signal in pulse form is generated in accordance with an input signal and a predetermined means is driven in accordance with the drive signal.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An output circuit for generating a pulse form drive signal in accordance with an input signal having an input frequency band and a changing voltage level, said drive signal being capable of driving a predetermined vibration means, said output circuit comprising:
    oscillation means for producing an output oscillation signal having a voltage level of triangular waveform and having a frequency higher than said input frequency band, said oscillation means being an amplitude adjustable type for varying the amplitude of the output oscillation signal and thereby varying the amplitude at which said vibration means is driven;
    polarity inversion means for inverting the polarity of said input signal and producing a corresponding inverted input signal;
    first comparison means for comparing the voltage level of said input signal with the voltage level of said output oscillation signal and producing a first comparison signal;
    second comparison means for comparing the voltage level of said inverted input signal with the voltage level of said output oscillation signal and producing a second comparison signal; and
    pulse application means for selectively supplying to said vibration means a pulse signal having a positive voltage for a period of time in which the voltage level of said input signal is higher than the voltage level of said output oscillation signal and for a period of time in which the voltage level of said inverted input signal is lower than the voltage level of said output oscillation signal, and for selectively supplying to said vibration means a pulse signal having a negative voltage for a period of time in which the voltage level of said input signal is lower than the voltage level of said output oscillation signal and for a period of time in which the voltage level of said inverted input signal is higher than the voltage level of said output oscillation signal.

2. An output circuit according to claim 1, wherein at least one of said first comparison means and said second comparison means comprises a voltage comparator for comparing a respective one of said input signal and said inverted input signal with said output oscillation signal.

3. An output circuit according to claim 1, wherein at least one of said first comparison means and said second comparison means comprises an adder circuit for adding a respective one of said input signal and said inverted input signal with said output oscillation signal and a zero-level comparator for comparing the output of said adder circuit with a zero level.

4. An output circuit according to claim 1, wherein said pulse application means supplies pulse signals from said first and second comparison means to positive and negative terminals of said vibration means.

5. An output circuit according to claim 4 wherein said vibration means is an earphone.

6. An output circuit according to claim 4 wherein said vibration means is an audio speaker.

7. An output circuit for generating a pulse form drive signal in accordance with an input signal having an input frequency band and a changing voltage level, said drive signal being capable of driving a predetermined vibration means, said output circuit comprising:
    oscillation means for producing an output oscillation signal having a voltage level of triangular waveform and having a frequency higher than said input frequency band;
    phase shifting means for shifting the phase of said input signal and producing a corresponding phase shifted input signal, said phase shifting means having a phase-shifting circuit for varying the amplitude at which said vibration means is driven by adjusting the phase of said input signal;
    first comparison means for comparing the voltage level of said input signal with the voltage level of said output oscillation signal and producing a first comparison signal;
    second comparison means for comparing the voltage level of said shifted input signal with the voltage level of said output oscillation signal and producing a second comparison signal; and
    pulse application means for supplying to said vibration means a pulse signal having a positive voltage for a period of time in which the voltage level of said input signal is higher than the voltage level of said output oscillation signal and for a period of time in which the voltage level of said phase shifted input signal is lower than the voltage level of said output oscillation signal, and for supplying to said vibration means a pulse signal having a negative voltage for a period of time in which the voltage level of said input signal is lower than the voltage of said output oscillation signal and for a period of time in which the voltage level of phase shifted input signal is higher than the voltage level of said output oscillation signal.

* * * * *